United States Patent
Padmanaban et al.

(10) Patent No.: US 6,329,117 B1
(45) Date of Patent: Dec. 11, 2001

(54) ANTIREFLECTION OR LIGHT-ABSORBING COATING COMPOSITION AND POLYMER THEREFOR

(75) Inventors: Munirathna Padmanaban, Somerville, NJ (US); Wen-Bing Kang, Shizuoka (JP); Georg Pawlowski, Shizuoka (JP); Ken Kimura, Shizuoka (JP); Hatsuyuki Tanaka, Shizuoka. (JP)

(73) Assignee: Clariant International, Ltd., Muttenz (CH)

( * ) Notice: Subject to any disclaimer, the term of this patent is extended or adjusted under 35 U.S.C. 154(b) by 0 days.

(21) Appl. No.: 09/319,129

(22) PCT Filed: Aug. 26, 1998

(86) PCT No.: PCT/JP98/03789

§ 371 Date: Aug. 9, 1999

§ 102(e) Date: Aug. 9, 1999

(87) PCT Pub. No.: WO99/18478

PCT Pub. Date: Apr. 15, 1999

(30) Foreign Application Priority Data

Oct. 8, 1997 (JP) .................................................. 9-275652

(51) Int. Cl.$^7$ .............................. G03C 1/73; G03C 5/16; C08F 120/18; C08F 20/58; C08F 24/00; C08F 12/30

(52) U.S. Cl. ..................................... 430/270.1; 430/280.1; 430/287.1; 430/271.1; 430/313; 430/319; 430/323; 430/325; 430/326; 430/905; 430/906; 430/907; 430/910; 526/273; 526/288; 526/304; 526/307.1; 526/329.5; 526/329.7

(58) Field of Search ..................................... 430/313, 319, 430/326, 283.1, 287.1, 280.1, 270.1, 271.1, 323, 325, 905, 906, 907, 910; 526/288, 273, 304, 302, 303.1, 307.1, 329.5, 329.7, 312

(56) References Cited

U.S. PATENT DOCUMENTS

| | | | |
|---|---|---|---|
| 5,093,414 | * 3/1992 | Rauterkus et al. | 524/813 |
| 5,525,457 | * 6/1996 | Nemoto et al. | 430/325 |
| 5,652,297 | * 7/1997 | McCulloch et al. | 430/423 |
| 5,733,714 | * 3/1998 | McCulloch et al. | 430/325 |

FOREIGN PATENT DOCUMENTS

| | | | |
|---|---|---|---|
| 0542008A1 | * | 5/1993 | (EP) . |
| 0583205A1 | * | 2/1994 | (EP) . |
| 0 823 661 | * | 2/1998 | (EP) . |
| 0 851 300 | * | 7/1998 | (EP) . |
| 59-166513 | * | 9/1984 | (JP) . |
| 1-165612 | * | 6/1989 | (JP) . |
| 2-150410 | * | 6/1990 | (JP) . |
| 6-75378 | * | 3/1994 | (JP) . |
| 6-88064 | * | 3/1994 | (JP) . |
| 6-88066 | * | 3/1994 | (JP) . |
| 6-118631 | * | 4/1994 | (JP) . |
| 6-118656 | * | 4/1994 | (JP) . |
| 6-321888 | * | 11/1994 | (JP) . |
| 8-224295 | * | 9/1996 | (JP) . |

* cited by examiner

Primary Examiner—Janet Baxter
Assistant Examiner—Sin J. Lee
(74) Attorney, Agent, or Firm—Krishna Banerjee

(57) ABSTRACT

A composition for an anti-reflective coating or a light absorbing coating, which shows good light absorption for lights of 100–450 nm in wavelength, suffers neither footing nor intermixing, and has excellent storage stability and step coverage, and novel copolymers to be used therein. The novel polymers comprise acrylic or methacrylic copolymers or terpolymers, at least having both recurring units (1) wherein an amino group- or hydroxyl-group containing organic chromophore capable of absorbing lights of 100 to 450 nm in wavelength is chemically bound to the carbonyl group bound to a carbon atom in the main chain, directly or through —$R_1$NHCXY— (wherein $R_1$ represents an alkylene group, X represents O or S, Y represents O or $NR_6$, $R_6$ represents H, a substituted or non-substituted, straight chain or cyclic alkyl group or a phenylene group) and for example recurring units (2) wherein a double bond-or epoxy group-containing alkyl group is chemically bound to the carboxyl or oxygen group bound to a carbon atom in the main chain. The composition containing the copolymer is coated on a wafer to form a bottom anti-reflective coating and, after coating thereon a photoresist, deep UV exposure and development are conducted to form a resist image with high resolution.

26 Claims, No Drawings

ANTIREFLECTION OR LIGHT-ABSORBING COATING COMPOSITION AND POLYMER THEREFOR

TECHNICAL FIELD

The present invention relates to a composition available for forming an anti-reflective coating such as a bottom anti-reflective coating or a light absorbing coating, a polymer used in the composition, a method for forming an anti-reflective coating or a light absorbing coating, an anti-reflective coating and a light absorbing coating formed by the method, a method for forming resist patterns and a method for integrated circuits by use of the composition.

BACKGROUND ART

In manufacturing semiconductors, finer and finer patterning of resist images has been required and attempted to attain higher integration. In order to satisfy this requirement, there have been made development and improvement of lithographic techniques using short-wavelength exposure tools such as deep-UV. As photoresists showing high performance when exposed to deep-UV, there have been known chemically amplified, deep UV (100–300 nm) positive- or negative-working photoresists. While such exposure tools in combination of the chemically amrplified, high performing photoresists enable one to pattern with less than quarter micron line width, there still remain several other problems that need to be solved in achieving such high resolutions. One such problem well known in the art is called "standing waves" arising from interference between incident light and reflected light of the incident light reflected on the substrate surface. Another problem is the difficulty in uniformly controlling the line width in single layer resist process due to thin film interference effects resulting from highly planar and non-planar substrates. Various reports have been made. For example, there are illustrated the report of M. Horn in Solid State Technology, Nov. 1991, p. 57, the report of T. Brunner, Proc. SPIE, vol. 1466 (1991), p.297, etc. In addition, as a cause which causes pattern distortions, there is the phenomenon called reflective notching which is caused by light reflected angularly from topographical features. This is discussed by M. Bolsen, G. Buhr, H. Merrem, and K. Van Werden, in Solid State Technology, Feb. 1986, p.83.

Lithographic techniques to solve the problems upon forming patterns on reflective topography include addition of dyes to the photoresists as described in U.S. Pat. Nos. 4,575,480 and 4,882,260, etc. However, when a dye is added to the photoresist to form a film having high absorption to the light of exposing wavelength, drawbacks such as decrease in resist sensitivity, difficulties during hardening processes, thinning of the resists in alkaline developers and sublimation of the dyes during baking of the films are encountered. In addition to the technique of adding dyes to photoresists, top surface imaging (TSI) processes, multilayer resists (MLR) method as described in U.S. Pat. No. 4,370,405 also help solve the problems associated with reflection but such methods are not only complex but also expensive and not a preferred method. Single layer resist (SLR) processes dominate semiconductor manufacturing because of their cost-effectiveness and simplicity.

Another strategy to eliminate the interference of lights is to reduce the substrate reflectivity through the use of so-called bottom anti-reflective coatings (BARCs). These coatings have the property of absorbing the light which passes through the photoresist and not reflecting it back and prevent the reflection by the substrate. As the bottom anti-reflective coatings, there are known inorganic types and organic types. Inorganic types include coatings of TiN, TiNO, TiW or inorganic polymer of 300 Å in thickness, as described in C. Nolscher et al., Proc. SPIE, vol. 1086 (1989), p.242, K. Bather, H. Schreiber, Thin Solid Films, 200, 93 (1991), G. Czech et al., Microelectronic Engineering, 21 (1993), p.51. In addition to these coatings, there are also known inorganic coatings such as a titanium coating, a chromium oxide coating, a carbon coating, an α-silicon coating, etc. These inorganic anti-reflective coatings are usually formed by vacuum deposition, CVD, sputtering or the like. However, formation of such coatings requires accurate control of the film thickness, uniformity of film, special deposition equipment, complex adhesion promotion techniques prior to resist coating, separate dry etching pattern transfer step, and dry etching for removal. Some of the inorganic coatings can not be used in manufacturing integrated circuits due to their conductivity.

On the other hand, as the organic anti-reflective coatings, there are illustrated those formulated by adding dyes which absorb light of the exposure wavelength to a polymer coating (Proc. SPIE, Vol. 539 (1985), p.342). This dye-containing, anti-reflective coating can be formed on a substrate in the same manner as with photoresists, and does not require any special equipment as is different from the inorganic anti-reflective coatings. However, they involve such problems as 1) separation of the polymer and dye components during spin coating, 2) dye stripping into resist solvents, and 3) thermal diffusion into the resist upon the baking process. All these factors cause degradation of resist properties, and therefore the technique of adding a dye to the polymer coating to form an anti-reflective coating is not a preferred one.

Chemically binding the dyes to film forming polymers is another option. Fahey, et al. (Proc. SPIE, Vol. 2195, p.422) report to use a reaction product obtained by reacting an amino group possessing dye with the anhydride groups of poly(vinylmethyl ether-co-maleic anhydride) as the material for forming the anti-reflective coating. The problem with this type anti-reflective coating material is that the reaction between amine and the anhydride groups are not always 100% complete and this leads to presence of free amines (refer European unexamined patent application No. 0583205, page 5, lines 17–20). The remaining free amine causes poisoning at the interface between the anti-reflective coating and the resist coating especially when a chemically amplified resist is used as the resist, and this leads to a problem called footing: incomplete dissolution of the exposed resist upon development. In addition, there arises another problem that free dye molecules sublime during the baking process and deposits on the fabrication instruments and causes contamination problem as well as health hazard to the workers. One more problem of such compositions is that imide compounds are poor in their solubility and need polar solvents normally not used in photoresist formulations. It would be ideal to use the same solvent for both the photoresist and the anti-reflective coating since the same coating apparatus is often used for applying the photoresist and the anti-reflective coating. Further, the by-product of imidization reaction, water, causes coating defects during film formation.

Another system Fahey et al. propose is materials wherein a copolymer of methyl methacrylate and 9-methylanthracene methacrylate is used as the anti-reflective coating. Again this system also shows footing problem due to the diffusion of photo-generated acid into the anti-reflective coating when a chemically amplified resist is used as the resist (Proc. SPIE, Vol. 2195, p. 426) as well as intermixing of the resist material and the anti-reflective coating material. Such polymers are also insoluble in preferred solvent in the art such as propylene glycol monomethyl ether acetate (PGMEA), ethyl lactate, etc.

U.S. Pat. No. 5,234,990 discloses polysulfone and polyurea resins which possess inherent light absorbing properties at particular deep ultra violet wavelengths. These condensation products have poor film forming property on a patterned wafer and therefore bad step-coverage and also formation of cracks perhaps due to high Tg and rigid structures of such polymers. Ideally, a bottom anti-reflective coating materials should be soft for good step coverage property before baking and also hardened at least after as baking to prevent intermixing of the photoresist and the anti-reflective coating as well as diffusion of the photo-generated acid.

Further, European unexamined patent application No. 542 008 discloses an anti-reflective coating composition capable of forming a hardened anti-reflective coating after being applied, which comprises a phenolic resin binder, melamine type cross-linking agents and a thermal or photo acid generators. Such compositions are poor in their storage stability due to the presence of the cross-linking agents and acid generators leading to high incidence of film defects, and their etch rate is very slow due to the presence of rather large amounts of aromatic functional groups.

In summary, a good bottom anti-reflective coating material should satisfy the following properties:

a) good film forming property;

b) high absorption at the desired exposure wavelength;

c) no intermixing with the photoresist;

d) etch rate much higher than the photoresist;

e) good step coverage on topography;

f) at least six months shelf-life stability; and g) the composition should be dissolved in an edge-bead rinse (EBR) solvent.

Unfortunately none of the available bottom anti-reflective coating satisfies these properties.

The present invention provides an anti-reflective or light-absorbing coating material which fulfils the above-described various properties; a composition containing this material and useful for forming an anti-reflective coating such as a bottom anti-reflective coating or a light-absorbing coating; a process for manufacturing the composition, and an anti-reflective or light absorbing coating using the material or the composition; a method for forming the coatings; a method for forming a resist pattern; and a process for manufacturing integrated circuits.

The first object of the present invention is to provide a composition capable of forming an anti-reflective coating or a light absorbing coating which reduces problems associated with reflected light from the substrate and topography during pattern formation.

The second object of the present invention is to provide a composition capable of forming an anti-reflective coating or a light absorbing coating having improved adhesion to micro-electronic substrates, very good coating uniformity and no particle formation.

The third object of the present invention is to provide a composition capable of forming an anti-reflective coating or a light absorbing coating that has significantly higher etch rate than the photoresist material applied on top of it.

The fourth object of the present invention is to provide novel polymers applicable for anti-reflective coatings or light absorbing coatings containing cross-linking and highly light-absorbing functions in a single molecule, and soluble in similar or same solvent as the photoresist material applied on top of it.

The fifth object of the present invention is to provide novel polymers applicable for anti-reflective coatings or light-absorbing coatings containing intrinsically cross-linking and highly absorbing functions in a single molecule eliminating the need for additives with cross-linking and highly light-absorbing functions.

The sixth object of the present invention is to provide novel polymers which are capable of curing (cross-linking) at the baking temperatures of the resulting anti-reflective coating or light absorbing coating to acquire such a high hardness after being baked that it is impossible for the photoresist top layer to cause intermixing with the coating, which cause no diffusion of an acid generated in the subsequent steps and thereby prevent footing.

The seventh object of the present invention is to provide novel polymers which have chromophores capable of highly absorbing light of exposure wavelength and can sufficiently absorb light in a film thickness of 30 to 300 nm, and which can form an extremely thin anti-reflective coating or a light absorbing coating.

The eighth object of the present invention is to provide a bottom anti-reflective coating or a light absorbing coating having good light absorbing properties.

The ninth object of the present invention is to provide a method for easily forming a resist pattern with high resolution.

The tenth object of the present invention is to provide a method for easily manufacturing an integrated circuit with higher integration.

Other objects of the present invention will become apparent from the following descriptions.

DISCLOSURE OF THE INVENTION

The above-described objects of the present invention can be attained by the polymers represented by the following general formula I or II and the anti-reflective coating or the light absorbing coating containing this polymer.

General formula I

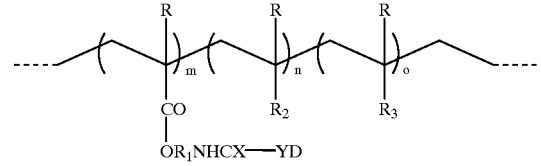

wherein
R is a hydrogen atom or an alkyl group; $R_1$ represents an alkylene group, a substituted alkylene group, a cycloalkylene group, a substituted cycloalkylene group, a phenylene group or a substituted phenylene group; $R_2$ represents an optionally substituted, vinyl group-containing phenyl group, —$OR_4$ or —$COOR_4$, in which $R_4$ is an alkyl group having a double bond or epoxy group; $R_3$ is a halogen atom, a cyano group, an acetate group, —COOH, —$CONH_2$, a substituted or non-substituted phenyl group, —$COOR_5$ or —$OR_5$, in which $R_5$ represents a substituted or non-substituted straight-chained, cyclic or branched alkyl group, or an alkyl or aryl group containing an ester or carbonyl group; X is either O or S; Y is either O or $N_6$ group in which $R_6$ is a hydrogen atom, an substituted or nonsubstituted phenyl or cyclic, straight-chained or branched alkyl group; D is an organic chromophore which absorbs the exposed wavelength (100–450 nm) and represents a substituted or non-substituted benzene ring, condensed ring, or heterocyclic ring bound directly or through an alkylene group; and m and n represents any number above zero, while o is any number including zero.

General Formula II

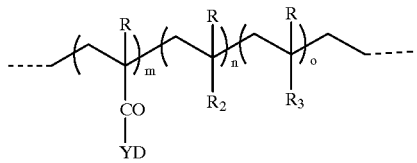

wherein

R is a hydrogen atom or an alkyl group; $R_2$ represents an optionally substituted, vinyl group-containing phenyl group, $—OR_4$ or $—COOR_4$, in which $R_4$ is an alkyl group having a double bond or epoxy group; $R_3$ is a halogen atom, a cyano group, an acetate group, $—COOH$, $—CONH_2$, a substituted or non-substituted phenyl group, $—COOR_5$ or $—OR_5$, in which $R_5$ is a substituted or non-substituted straight-chained, cyclic or branched alkyl group, or an alkyl or aryl group containing an ester or carbonyl group; Y is either O or $NR_6$ group in which $R_6$ is a hydrogen atom, a substituted or non-substituted phenyl or cyclic, straight-chained or branched alkyl group; D is an organic chromophore which absorbs the exposed wavelength (100–450 nm) and represents a substituted or non-substituted, benzene ring, condensed ring, or heterocyclic ring bound directly or through an alkylene group; and m and n represents any numbers above zero, while o is any number including zero.

In addition, according to the present invention, there can be obtained an anti-reflective coating and a light absorbing coating having a good non-intermixing property and neither causing footing nor leaving remaining resist film by using a composition for an anti-reflective coating or a light absorbing coating which contains a polymer containing at least the recurring unit represented by the following general formula III or IV, a cross-linking agent and an optional ingredient of a thermal acid-generator.

General formula III

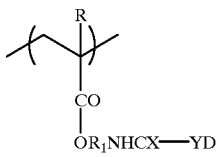

General formula IV

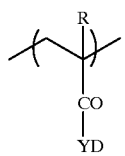

In the general formulae III and IV, R is a hydrogen atom or an alkyl group; $R_1$ represents an alkylene group, a substituted alkylene group, a cycloalkylene group, a substituted cycloalkylene group, a phenylene group or a substituted phenylene group; X is either O or S; Y is either O or $NR_6$ group in which $R_6$ is a hydrogen atom, a substituted or non-substituted phenyl or cyclic, straight-chained or branched alkyl group; D is an organic chromophore which absorbs the exposed wavelength (100–450 nm) and represents a substituted or non-substituted, benzene ring, condensed ring, or a heterocyclic ring bound directly or through an alkylene group.

The composition for anti-reflective coating or light absorbing coating containing the polymer having at least the recurring unit represented by the general formula III or IV and the cross-linking agent shows improved properties as described above, and addition of a thermal acid-generator to the composition serves to more improve the properties of the composition. Therefore, a composition for anti-reflective coating or light absorbing coating containing the polymer having at least the recurring unit represented by the general formula III or IV, the cross-linking agent, and the thermal acid-generator is more preferred. As to the proportion of the polymer having at least the recurring unit represented by the general formula III or IV and the cross-linking agent, the polymer having at least the recurring unit represented by the general formula III or IV is incorporated in an amount of preferably 50 to 95 parts by weight, and the cross-linking agent in an amount of 50 to 5 parts by weight. The optional component of thermal acid-generator is used in an amount of preferably 1 to 10 parts by weight based on the polymer.

In accordance with the present invention, each of the above mentioned compositions is coated by a known coating method such as spin coating method, spray coating method, dip coating method or roller coating method in a dry thickness of, for example, 300–50,000 Å onto a reflective semiconductor substrate such as silicon undercoated with hexamethyldisilazane and baked to evaporate the solvent to form a thin film of anti-reflective coating such as bottom anti-reflective coating or light absorbing coating. Baking is conducted usually at 50 to 250° C. A desired photoresist is applied on this thin film and, after patternwise exposure, it is developed to form a resist pattern with a desired line width. This resist pattern is dry or wet etched to transfer an image on the substrate. Integrated circuits with high integration can be manufactured by further conducting necessary steps such as plating, deposition, ion diffusion, ion implantation, etc.

The polymer of the present invention represented by the general formula I or II can be synthesized as shown in following reaction scheme 1 or 2.

Reaction scheme 1

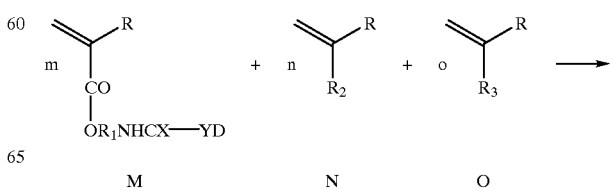

-continued

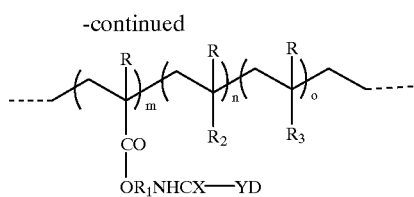

Reaction scheme 2

```
    R              R              R
m  ‖      +   n   ‖     +   o   ‖       →
   CO             R₂             R₃
   │
   YD
```

P

```
      R              R              R
----( -|- )---( -|- )---( -|- )----
      |    m         n         o
      CO            R₂             R₃
      │
      YD
``` wherein

R is a hydrogen atom or an alkyl group; $R_1$ represents an alkylene group, a substituted alkylene group, a cycloalkylene group, a substituted cycloalkylene group, a phenylene group or a substituted phenylene group; $R_2$ is an optionally substituted, vinyl group-containing phenyl group, —$OR_4$ or —$COOR_4$ in which $R_4$ is an alkyl group which has a double bond or epoxy group; $R_3$ is a halogen atom, a cyano group, an acetate group, —COOH, —$CONH_2$, a substituted or non-substituted phenyl group, —$COOR_5$ or —$OR_5$ in which $R_5$ is a substituted or non-substituted straight-chained, cyclic or branched alkyl group, or an alkyl or aryl group containing an ester or carbonyl group; X is either O or S; Y is either O or $NR_6$ group in which $R_6$ is a hydrogen atom, an optionally substituted phenyl or cyclic, straight-chained or branched alkyl group, D is an organic chromophore which absorbs the exposed wavelength (100–450 nm) and represents a substituted or non-substituted, benzene ring, condensed ring, or heterocyclic ring bound directly or through an alkylene group; and m and n represents any number above zero, while o is any number including zero.

Of the polymers represented by the general formulae I and II, those polymers wherein R represents a hydrogen atom or a methyl group, $R_1$ represents an ethylene group, $R_2$ represents an optionally substituted, vinyl group-containing phenyl group, —$OR_4$ or —$COOR_4$ in which $R_4$ represents an alkyl group containing a double bond, X represents oxygen, Y represents oxygen or a NH group, m, n and o each represents any number above zero are illustrated as preferred materials for manufacturing the composition for the anti-reflective coating or the light absorbing coating. Where $R_3$ represents —$COOR_5$, $R_5$ preferably represents a methyl group, an acetoacetoxyethyl group, an ethyl group, a cyclohexyl group or a hydroxyethyl group.

As examples of D the following groups are given but by no means limited to these examples: phenyl, substituted phenyl, benzyl, substituted benzyl, naphthalene, substituted naphthalene, anthracene, substituted anthracene, anthraquinone, substituted anthraquinone, acridine, substituted acridine, azobenzene, substituted azobenzene, fluorene, substituted fluorene, fluorenone, substituted fluorenone, carbazole, substituted carbazole, N-alkylcarbazole, dibenzofuran, substituted dibenzofuran, phenanthrene, substituted phenanthrene, pyrene, substituted pyrene, etc. The substitutions in the above description can be one or more of the following groups of: alkyl, aryl, halogen, alkoxy, nitro, aldehyde, cyano, amide, dialkylamino, sulfonamide, imide, carboxylic acid, carboxylic acid ester, sulfonic acid, sulfonic acid ester, alkylamino, arylamino, etc.

Preferred examples of comonomer N and O in reaction schemes 1 and 2 are acrylates, methacrylates, vinyl ethers and styrene and it's derivatives. Specific examples of comonomer N include p-divinylbenzene, m-divinylbenzene, allyl vinyl ether, glycidyl methacrylate and allyl methacrylate. Comonomer O is used for imparting, to the polymer, high light absorbing property, high etch rate, solubility for a particular solvent, good storage stability, curing (cross-linking) property or other desirable properties. For example, it is well known among those skilled in the semiconductor industry that etch rate of the anti-reflective coating should be much faster than that of the resist in order to obtain good pattern transfer in the processing step after patternwise exposure. Since aromatic compounds generally show poor etch rate, it is preferred to use, as a comonomer, aliphatic monomers or monomers containing other atoms than carbon such as oxygen, nitrogen or halogen atom for the purpose of attaining an increased etch rate. In addition, glass transition temperature (Tg) plays an important role in the intermixing property between the anti-reflective coating or light absorbing coating and a photoresist coated thereon. Since the photoresist is applied onto the anti-reflective coating and exposed and developed, intermixing between the anti-reflective coating and the photoresist would lead to incomplete removal of the photoresist material upon development. Yet another problem when a chemically amplified photoresist material is applied onto the anti-reflective coating or light absorbing coating with low Tg is that the acid formed in the resist upon exposure may diffuse into the anti-reflective coating or the like which leads to a distorted latent acid image and this can also cause incomplete removal of the photoresist material upon development. Therefore, it is desirable that anti-reflective coating materials or the like preferably have a glass transition temperature of at least above the maximum processing temperature used during thermal processings such as baking. Further, as comonomers for imparting solubility to the polymer, acrylates, methacrylates, etc. are usually used and, for increasing Tg, styrene and its derivatives are used.

As examples of comonomer O there are illustrated methyl methacrylate, 2-hydroxyethyl methacrylate, ethyl methacrylate, methyl acrylate, 2-(methacryloyloxy)ethyl methacrylate, acrylic acid, acrylonitrile, acrylamide, 2-isocyanatoethyl methacrylate, 4-acetoxystyrene, 3-methyl-4-hydroxystyrene, styrene, vinyl chloride, ethyl vinyl ether, butyl vinyl ether, isobutyl vinyl ether, cyclohexyl vinyl ether, methyl vinyl ether, vinyl acetate, 2-isocyanatoethyl acrylate, etc. To illustrate these comonomers according to the properties to be imparted by them, there are those comonomers which further increase light absorbing property when used together with the organic chromophores, such as 2-isocyanatoethyl methacrylate, 2-isocyanatoethyl acrylate, etc.; those comonomers which accelerates etch rate such as methyl methacrylate, 2-hydroxyethyl methacrylate, ethyl methacrylate, methyl acrylate, acrylic acid, vinyl chloride, etc.; those comonomers which improve solubility for the solvents commonly used as solvents for photoresist such as propylene glycol monomethyl ether acetate (PGMEA) or ethyl lactate, such as 2-(methacryloyloxy)ethyl methacrylate, acrylic acid, 4-acetoxystyrene, 3-methyl-4-hydroxystyrene, ethyl vinyl ether, butyl vinyl ether, isobutyl vinyl ether, cyclohexyl vinyl ether, methyl vinyl ether, vinyl acetate, etc.; those comonomers which improve curing (cross-linking) property such as 2-isocyanatoethyl methacrylate, 2-isocyanatoethyl acrylate, etc.; and those comonomers which increase Tg such as styrene, 3-methyl-4-hydroxystyrene, etc. However, the above-described specific examples and illustration according to the properties to be imparted should be construed as illustrative, and are not to be construed to limit the present invention. The polymers of the present invention may further contain, as comonomers, dicarboxylic acid anhydrides or imides of dicarboxylic acid such as maleic anhydride, maleimide, N-substituted maleimide, etc. Two or more of the monomer components M, N, O and P including the optional comonomers may be used at the same time.

Polymerization process of the present invention can be carried out in a suitable solvent using free radical or ionic reaction initiators. The copolymers of the present invention may be of various structure such as random copolymers, block copolymers, etc. Preferred solvents to carry out the polymerization include toluene, tetrahydrofuran, benzene, dimethylformamide, dimehtylsulfoxide, ethyl lactate, propylene glycol monomethyl ether acetate (PGMEA), etc. These solvents may be used independently or as a combination of two or more of them.

Specific examples of reaction initiators include but not restricted to 2,2'-azobis(isobutyronitrile) (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobis(2,4-dimethylpentanenitrile), 1,1'-azobis(cyclohexanecarbonitrile), benzoylperoxide, t-butylperoxybenzoate, di-t-butyl diperoxyphthalate, t-butyl peroxy-2-ethylhexanoate, t-butyl peroxypivalate, t-amylperoxypivalate, butyllithium, etc.

The molecular weight of the copolymers prepared in reaction schemes 1 and 2 ranges between 500 to 5,000,000 daltons with respect to standard polystyrene as measured on a gel-permeation chromatography (GPC). Preferred molecular weight lies between 3,000 and 100,000 daltons considering the film forming property, solubility characteristics, and thermal stability. The molecular weights of the obtained polymers depend on the polymerization conditions such as polymerization time, polymerization temperature, concentrations of the monomers and initiators used, reaction medium, etc. Therefore, molecular weight of the polymer can easily be controlled by optimizing these parameters. Polymers with a narrow molecular weight distribution can also be obtained by choosing ionic polymerization.

The mole ratio of comonomers in the copolymer in the reaction schemes 1 and 2 depends on the reaction rate of the respective monomers as well as the reaction conditions used and the molar ratio of the comonomers taken in the reaction feed. The absorption at the desired wavelength and refractive index of the final polymer play an important role in the applicability of the polymer for anti-reflective coatings or light absorbing coatings. Absorption in the range of 2 to 40 per micron film thickness is desired and between 5 and 25 is especially preferred. Higher and lower absorption are not preferred as an anti-reflective coating. Refractivity index required for the bottom anti-reflective coating depends upon the refractivity index of the photoresist material applied on it. The refractive index of the bottom anti-reflective coating would be the best if it exactly matches or at least lies closer to that of the resist layer applied thereon. The mole percent of the monomer containing the chromophore is important to control the absorption property since light absorbing property of the anti-reflective coating material depends on the molar absorptivity of the monomer and it's mole ratio in the copolymer. Additionally, polymers having at least the recurring unit represented by the general formula III or IV contain, as comonomers, comonomer components of the foregoing general formula I or II, and can be prepared in the same manner as with the polymers represented by the general formula I or II. In this case, in the foregoing reaction scheme 1 or 2, for example, m is a number greater than 0 and n and o are numbers including 0.

After being separated from the solvent, these polymers can be again dissolved in a proper solvent to prepare a composition for an anti-reflective coating or a light absorbing coating, and those polymers which permit to use the solvent used in synthesizing them also as the solvent for preparing the composition for the anti-reflective coating or light absorbing coating can be directly used as the composition for the anti-reflective coating or light absorbing coating without separation from the solvent. In such occasion, the solution after completion of the polymerization reaction can be directly applied onto a substrate such as wafer. The composition of the present invention for the anti-reflective coating or light absorbing coating is preferably filtered using, for example, 0.5 and 0.2 micron filters to remove insoluble fine particles. The thus filtered solution is directly coated on a substrate such as wafer, then baked at a temperature of 50 to 250° C. to form an anti-reflective coating or a light absorbing coating.

In forming the anti-reflective coating or the light absorbing coating, it is also important for the coating-making materials to have enough solubility for the solvent. As the solvent for the composition for an anti-reflective coating or a light absorbing coating, any solvent may be used as long as it has a good film-forming property and can dissolve optional components such as surfactants, plasticizers, cross-linking agents or like additives. Solvents with enough safety are preferred, but solvents to be used are not limited to such safe solvents. From the viewpoint of safety and, further, dissolving ability, boiling point and film-forming ability, propylene glycol monomethyl ether acetate (PGMEA), ethyl lactate (EL), propylene glycol monomethyl ether, cyclohexanone, cyclopentanone, 2-heptanone, etc. are preferred as the solvents. These solvents may be used independently or as a combination of two or more. As is described above, solubility of the polymer of the present invention can be controlled by properly selecting comonomers in the reaction schemes 1 and 2.

In using the copolymer of the present invention represented by the general formula I or II in the composition for an anti-reflective coating or light absorbing coating, additives such as surfactants, plasticizers, cross-linking agents, thermal acid-generators, other polymers than the copolymers of the present invention may be incorporated in the composition, if necessary, for forming a uniform, defect-free anti-reflective coating or light absorbing coating on a semiconductor substrate. As the surfactants, there are illustrated fluorine-containing compounds or siloxane compounds, though not being limitative at all. In the case of using the polymer containing the recurring units represented by the general formula III and/or IV, a cross-linking agent and, as an optional component, a thermal acid-generator in the composition for the anti-reflective coating or the light absorbing coating, it is also possible to incorporate, if necessary, additives such as surfactants, plasticizers, polymers other than the copolymers of the present invention, etc. Use of the cross-linking agent serves to form an anti-reflective coating or a light absorbing coating having good non-intermixing property with a photoresist and causing no footing and leaving no resist residue. Additionally, copolymers of the present invention represented by the general formula I or II, which have cross-linking groups within them, show good non-intermixing property and non-footing property owing to cross-linking or condensation of film matrix upon baking. As the cross-linking agents, there are illustrated, for example, hexamethylmelamine, hexamethoxymethylmelamine, 1,2-dihydroxy-N,N'-methoxymethylsuccinimide, 1,2-dimethoxy-N,N'-methoxymethylsuccinimide, tetramethoxymethylglycolurile, and N,N'-methoxymethylurea and, as the thermal acid-generator, there are illustrated, for example, N-trifluoromethyl-sulfonyloxyphthalimide, N-trifluoromethyl-sulfonyloxy-1, 8-naphthalimide, N-methanesulfonyloxyisophthalimide, etc.

With the copolymers of the present invention represented by the general formula I or II, copolymerization ratio is generally such that m and n are 10–50 mol % and 1–40 mol %, respectively.

The bottom anti-reflective coating material or the light absorbing coating material of the present invention permit to use either a positive-working resist or a negative-working resist to be coated thereon and are not particular about the type of the resist. Therefore, any of those which are conventionally known as resists may be used. With any type resist, the material of the present invention enables one to form an image suffering no standing wave and no reflection notching due to reflection, provide development property of not causing diffusion of photo-generated acid, and form an image with high resolution. Additionally, as the resist, chemically amplified resists and quinonediazide type resists are preferred from the viewpoint of resolution or the like. Exposure is conducted using lights of 100 to 450 nm in wavelength.

BEST MODE FOR PRACTICING THE INVENTION

The present invention is described in more detail by way of examples which, however, are not intended to limit the scope of the present invention.

In the following examples, the bottom anti-reflective coating (BARC) was formed to evaluate the bottom anti-reflective coating materials according to the methods described in the following Application Example unless otherwise described.

APPLICATION EXAMPLE 1

A 3 wt % solution of the bottom anti-reflective coating material in an appropriate solvent was filtered using 0.5 and 0.2 micron filters, spin coated onto a 4 inches in diameter silicon wafer at suitable r.p.m. for 40 seconds such that the bottom anti-reflective coating film has a thickness of 60 nm after baking at 200° C. for 60 seconds. The film was checked under microscope to identify any defects. The optical constants n (refractive index) and k (absorption parameter) values of the film were measured on an elipsometer at the wavelength of 248 nm.

Then, a 700-nm thick (after being baked) positive- or negative-working, chemically amplified deep UV photoresist, a 500-nm thick positive-working resist for argon fluoride (193 nm) or a 1000-nm positive- or negative-working i-line novolak resist was applied onto the bottom anti-reflective coating by spin-coating at a suitable r.p.m. for 40 seconds. The resist was soft baked for 60 seconds at 110° C. and exposed on a stepper operating with an excimer laser (248 nm) source in the case of the deep UV resist, on a stepper operating with an argon fluoride light source in the case of the resist for 193-nm exposure, or an i-line (356 nm) stepper in the case of i-line resist using a reticle with line and space patterns. Following the exposure, the resist was baked at 90° C., developed for 60 seconds at 23° C. using a 0.005 N tetramethylammonium hydroxide developer solution in the case of the resist for argon fluoride or a 2.38 wt % tetramethylammonium hydroxide developer solution in other cases to form the resist pattern. The resist patterns were examined on a scanning electron microscope to check the resolution, standing waves, reflective notching, and footing of the line and space.

In order to evaluate the step-coverage property of the bottom anti-reflective coating material, the bottom anti-reflective coating material and the resist was again coated in this order on the patterned wafer and processed as described above, and the thus-formed pattern was checked using a scanning electron microscope. The etch rate of bottom anti-reflective coating materials were evaluated using oxygen and fluoride gas plasma.

Additionally, resists used for the evaluation are as follows.

Chemically Amplified Deep UV Photoresist
  Deep UV resist AZ-DX-1100P, manufactured by Hoechist A.G.
Positive-working Resist for 193-nm Exposure

| Ternary copolymer | (Charged ratio) |
|---|---|
| t-Butyl methacrylate | 30 |
| Methacrylic acid | 40 |
| Adamantyl methacrylate | 30 |
| Mw = 20,000 | |
| Amount of ternary copolymer | 20 wt % based on solvent (PGMEA) |
| Biscyclohexyldiazomethane | 1 wt % based on solvent (PGMEA) |

Novolak Resist for i-line Exposure
  i-Line resist AZ-7500, manufactured by Hoechist A.G.

The monomers for preparing the copolymers of the present invention were prepared according to the following Reference Examples.

REFERENCE EXAMPLE 1

Synthesis of N-(1-anthracene)-N'-(2-methacryloyloxyethyl)urea

In a dry three neck flask fitted with dropping funnel and thermometer, there was added 38.65 g (0.2 mol) of 1-aminoanthracene and it was dissolved in 200 g of dry tetrahydrofuran. The solution was cooled to 10° C. using a ice-water bath and to the cooled solution, there was added 31.03 g of 2-methacryloyloxyethyl isocyanate drop by drop from the dropping funnel. After the addition of 2-methacryloyloxyethyl isocyanate, the solution was allowed to return to room temperature (25° C.) and it was stirred at that temperature for 24 hours. The reaction mixture is a homogenous solution in the beginning and as the reaction between the isocyanate groups and aminoanthracene proceeds, a yellow color crystalline product appear in the solution. The product was filtered using a glass filter, washed with n-hexane at least for 3 times and dried at 40° C. under vacuum (1 Torr). The product has a melting point of 180±2° C. The yield was 95%.

It was characterized using IR and NMR techniques. The infra-red spectrum of the product showed peaks at 3341 cm$^{-1}$ (N—H), 1715 cm$^{-1}$ (C=O, ester) and at 1635 cm$^{-1}$ (C=O, urea) as well as the complete disappearance of the bond at 2278 cm$^{-1}$ characteristic of the isocyanate groups of the starting material methacryloyloxyethyl isocyanate. The $^1$H-NMR spectrum of the product showed signals at 1.9 ppm (3H/—CH$_3$), 3.3 (2H) and 4.2 (2H) ppm (CH$_2$), 5.7, 6.1 and 6.8 ppm [2H/CH$_2$=C(CH$_3$)], 7.5–8.8(9H/anthracene H). The molar absorption of the compound at 248 nm was $2.1 \times 10^4$ measured in methanol.

REFERENCE EXAMPLE 2

Synthesis of N-(2-methacryloyloxyethyl)-9-methylanthracene carbamate

In a dry three neck flask fitted with dropping funnel and thermometer, there was added 41.65 g (0.2 mol) of 9-hydroxymethyl anthracene, 0.126 g of dibutyltin dilaurate and they were dissolved in 200 g of dry tetrahydrofuran. The solution was cooled to 10° C. using a ice-water bath and to the cooled solution, there was added 31.03 g (0.2 mol) of 2-methacryloyloxyethyl isocyanate drop by drop from the dropping funnel. After the addition of 2-methacryloyloxyethyl isocyanate, the solution was allowed to return to room temperature (25° C.) and it was stirred at that temperature for 24 hours. Unlike Example 1, the reaction mixture was homogenous through out the reaction. The solution was crystallized using THF/n-hexane mixed solvent, it was filtered using a glass filter, washed with n-hexane at least for 3 times and dried at 40° C. under vacuum (1 Torr). The product has a melting point of 125±2° C. The yield was 95%.

It was characterized using IR and NMR techniques. The infra-red spectrum of the product showed peaks at 3323 cm$^{-1}$ (N—H), 1717 cm$^{-1}$ (C=O, ester) and at 1707 cm$^{-1}$ (C=O, carbamate) as well as the complete disappearance of the bond at 2278 cm$^{-1}$ characteristic of the isocyanate groups of the starting material methacryloyloxyethyl isocyanate. The $^1$H-NMR spectrum of the product showed signals at 1.82 ppm (3H/—CH$_3$), 3.3 (4H/CH$_2$) and 4.083 (2H) ppm (CH$_2$), 5.6–6.1 ppm [2H/CH$_2$=C(CH$_3$)], 7.3–8.7(9H/anthracene H). The molar absorption of the compound measured in methanol was found to be $9.9 \times 10^4$ at 248 nm.

REFERENCE EXAMPLE 3

Synthesis of 9-anthracenemethyl Methacrylate

In a dry three neck flask fitted with dropping funnel, thermometer and reflux condenser, there was added 87.5 g (0.42 mol) of 9-anthracene methanol, 500 ml of ethyl acetate, and 7.3 g (0.060 mol) of 4-dimethylamino pyridine. To this solution, there was added 83 g (0.54 mol) of methacrylic anhydride drop wise over a period of one hour under constant stirring. After completion of the addition of methacrylic anhydride, the reaction mixture was heated to 60° C. and stirred at that temperature for 4 hours. The solution was cooled to room temperature and the organic layer was washed with aqueous alkaline solution followed by water. The target product was obtained by evaporating the solvent of the organic layer. The crude yield was 80 g (73%).

It was characterized using IR and NMR techniques. The infra-red spectrum of the product showed peak at 1717 cm$^{-1}$ (C=O, ester). The $^1$H—NMR spectrum of the product showed signals at 1.82 ppm (s, 3H), 5.59 (s, 1H), 5.9 (s, 1H), 6.2 (s, 2H), 7.49–7.7 (m, 4H), 8.12 (m, 2H), 8.4 (m, 2H), 8.67 (s, 1H). The molar absorption of the compound at 248 nm was found to be $1.05 \times 10^5$ measured in methanol.

REFERENCE EXAMPLE 4

Synthesis of N-anthracene Methacrylamide 25 g (0.13 mol) of 1-aminoanthracene was dissolved in 120 ml of ethylacetate and to this solution, there was added 0.61 g (0.005 mol) of 4-dimethylaminopyridine. To the above solution thus prepared, there was added 24.6 g (0.16 mol) of methacrylic acid anhydride drop wise over a period of 20 minutes. The reaction mixture was heated at 60° C. for 4 hours and the solution was cooled. The yellow precipitate obtained upon cooling was filtered, washed with ethyl acetate, and dried under vacuum. The yield was 18.6 g (60 g). The molar absorptivity of the compound measured in methanol at 248 nm was found to be $4.1 \times 10^4$.

EXAMPLE 1

Copolymerization of N-(2-methacryloyloxyethyl)-9-methylanthracene carbamate and glycidyl methacrylate and application as a bottom anti-reflective coating In a three neck flask fitted with condenser, nitrogen inlet and outlet, there was added 3.634 g (0.01 mol) of N-(2-methacryloyloxyethyl)-9-methylanthracene carbamate, 2.844 g (0.02 mol) of glycidyl methacrylate, 0.28 g of α,α'-azobis(isobutyronitrile) and 70 g of tetrahydrofuran and the contents were purged with dry nitrogen. The reaction mixture was heated to 70° C. and stirred at that temperature for 5 hours under flowing nitrogen. After the completion of the reaction, it was cooled to room temperature and the polymer was reprecipitated into isopropanol. The white powder was dried under vacuum (1 Torr) at room temperature to yield 4.7 g (70%) of polymer. The copolymer was found to have about 54 mol % of glycidyl methacrylate units based on the $^1$H-NMR spectrum. The polymer had a weight average molecular weight (Mw) of 32,242 and number average molecular weight (Mn) of 13,652 as measured on a gel-permeation chromatography using polystyrene standard. The polymer was dissolved in propyleneglycol monomethyl ether acetate (PGMEA) (3 wt % solids) and applied as a bottom anti-reflective coating material and evaluated as described in the Application Example 1. The profiles showed no standing wave due to reflection and scattering of light however some intermixing between the bottom anti-reflective coating and resist was observed due to insufficient hardening of the film during baking. The bottom anti-reflective coating material had n and k values of 1.49 and 0.51 respectively at 248 nm and etch rate of 141 nm/min. On the contrast, the etch rate of the deep UV resist AZ-DK-1100P manufactured by Hoechst A.G.

EXAMPLE 2

Terpolymerization of N-(2-methacryloyloxyethyl)-9-methylanthracene carbamate, 2-hydroxyethyl methacrylate, and glycidyl methacrylate and application as a bottom anti-reflective coating In a three neck flask fitted with condenser, nitrogen inlet and outlet, there was added 3.634 g (0.01 mol) of N-(2- methacryloyloxyethyl)-9-methylanthracene carbamate, 2.13 g (0.015 mol) of glycidyl methacrylate, 1.98 g (0.015 mol) of glycidyl methacrylate, 0.31 g of α,α'-azobis (isobutyronitrile) and 70 g of tetrahydrofuran and the contents were purged with dry nitrogen. The reaction mixture was heated to 70° C. and stirred at that temperature for 5 hours under flowing nitrogen. After the completion of the reaction, it was cooled to room temperature and the polymer was reprecipitated into isopropanol. The white powder was dried under vacuum (1 Torr) at room temperature to yield 5.81 g (75%) of polymer. The terpolymer was found to have about 20 mol % of glycidyl methacrylate units based on the $^1$H-NMR spectrum. The polymer had a weight average molecular weight (Mw) of 22,000 and number average molecular weight (Mn) of 13,350 as measured on a gel-permeation chromatography using polystyrene standard.

The polymer was dissolved in propylene glycol monomethyl ether acetate (PGMEA) (3 wt % solids) and applied as a bottom anti-reflective coating material as described in the Application Example 1. The profiles showed no standing waves due to reflection and scattering of light, the intermixing between resist and the bottom anti-reflective coating was reduced compared to the bottom anti-reflective coating material of Examples 1 due to cross-linking by the presence of reactive hydroxyl groups and glycidyl units. And the bottom anti-reflective coating material had n and k values of 1.56 and 0.40 respectively at 248 nm, and an etch rate of 144 nm/min.

EXAMPLE 3

Terpolymerization of N-(1-anthracene)-N'-(2-methacryloyloxyethyl)urea, 2-hydroxyethyl methacrylate, and glycidyl methacrylate and application as a bottom anti-reflective coating This terpolymer was prepared similar to Example 2 except that N-(2-methacryloyloxyethyl)-9-methylanthracene carbamate was replaced with N-(1-anthracene)-N'-(2-methacryloyloxyethyl)urea. The terpolymer was found to have about 20 mol % of glycidyl methacrylate units based on the $^1$H-NMR spectrum. The polymer had a weight average molecular weight (Mw) of 26,450 and number average molecular weight (Mn) of 11,340 as measured on a gel-permeation chromatography using polystyrene standard.

The polymer was dissolved in propylene glycol monomethyl ether acetate (PGMEA) (3 wt % solids) and applied as a bottom anti-reflective coating material and evaluated as described in the Application Example 1. The profiles showed no standing waves due to reflection and scattering of light, the bottom anti-reflective coating material had n and k values of 1.56 and 0.43 respectively at 248 nm, and an etch rate of 140 nm/min. The intermixing bottom anti-reflective coating was reduced compared to the material of Example 1 as with Example 2.

EXAMPLE 4

Copolymerization of N-(2-methacryloyloxyethyl)-9-methylanthracene carbamate and allyl methacrylate and application as a bottom anti-reflective coating In a three neck flask fitted with condenser, nitrogen inlet and outlet, there was added 3.634 g (0.01 mol) of N-(2-methacryloyloxyethyl)-9-methylanthracene carbamate, 3.78 g (0.03 mol) of allyl methacrylate, 0.30 g of α,α'-azobis (isobutyronitrile) and 74 g of tetrahydrofuran and the contents were purged with dry nitrogen. The reaction mixture was heated to 70° C. and stirred at that temperature for 5 hours under flowing nitrogen. After the completion of the reaction, it was cooled to room temperature and the polymer formed was reprecipitated into isopropanol. The white powder was dried under vacuum (1 Torr) at room temperature to yield 6.1 g (82%) of polymer. The copolymer was found to have about 70 mol % of allyl methacrylate units based on the $^1$H-NMR spectrum. The polymer had a weight average molecular weight (Mw) of 34,054 and number average molecular weight (Mn) of 12,322 as measured on a gel-permeation chromatography using polystyrene standard.

The polymer was dissolved in propylene glycol monomethyl ether acetate (PGMEA) (3 wt % solids) and applied as a bottom anti-reflective coating material as described in the Application Example 1. The profiles showed no standing waves due to reflection and scattering of light and the bottom anti-reflective coating material had n and k values of 1.58 and 0.43 respectively at 248 nm and etch rate of 149 nm/min. And no intermixing between resist and the bottom anti-reflective coating was observed.

EXAMPLE 5

Copolymerization of N-(1-anthracene)-N'-(2-methacryloyloxyethyl)urea and allyl methacrylate and application as a bottom anti-reflective coating Copolymerization was carried out similar to Example 4 except that N-(2-methacryloyloxyethyl)-9-methylanthracene carbamate was replaced with N-(1-anthracene)-N'-(2-methacryloyloxyethyl) urea. The copolymer was found to have about 64 mol % of allyl methacrylate units based on the $^1$H-NMR spectrum. The polymer obtained had a weight average molecular weight (Mw) of 30,000 and number average molecular weight (Mn) of 13,455 as measured on a gel-permeation chromatography using polystyrene standard.

The polymer was dissolved in propylene glycol monomethyl ether acetate (PGMEA) (3 wt % solids) and applied as a bottom anti-reflective coating material and evaluated as described in the Application Example 1. The profiles showed no standing waves due to reflection and scattering of light and the bottom anti-reflective coating material had n and k values of 1.64 and 0.46 respectively at 248 nm and etch rate of 139 nm/min. Additionally, no intermixing between resist and the bottom anti-reflective coating was observed.

EXAMPLE 6

Terpolymerization of N-(2-methacryloyloxyethyl)-9-methylanthracene carbamate, methyl methacrylate, and allyl methacrylate and application as a bottom anti-reflective coating In a three neck flask fitted with condenser, nitrogen inlet and outlet, there was added 3.634 g (0.01 mol) of N-(2-methacryloyloxyethyl)-9-methylanthracene carbamate, 2.00 g (0.02 mol) of methyl methacrylate, 1.26 g (0.01 mol) of allyl methacrylate, 0.28 g of α,α'-azobis(isobutyronitrile) and 78 g of tetrahydrofuran and the contents were purged with dry nitrogen. The reaction mixture was heated to 70° C. and stirred at that temperature for 5 hours under flowing nitrogen. After the completion of the reaction, it was cooled to room temperature and the polymer formed was reprecipitated into isopropanol. The white powder was dried under vacuum (1 Torr) at room temperature to yield 4.5 g (65%) of polymer. The terpolymer was found to have about 20 mol % of allyl methacrylate units based on the $^1$H-NMR spectrum. The polymer had a weight average molecular weight (Mw) of 23,650 and number average molecular weight (Mn) of 9,265 as measured on a gel-permeation chromatography using polystyrene standard.

The polymer was dissolved in propylene glycol monomethyl ether acetate (PGMEA) (3 wt % solids) and applied as a bottom anti-reflective coating material and evaluated as described in the Application Example 1. The profiles showed no standing waves due to reflection and scattering of light and the bottom anti-reflective coating material had n and k values of 1.56 and 0.38 respectively and etch rate of 148 nm/min. Additionally, no intermixing between resist and the bottom anti-reflective coating was observed.

EXAMPLE 7

Copolymerization of N-anthracene methacrylamide and allyl methacrylate and application as a bottom anti-reflective coating Copolymerization was carried out similar to Example 4 except that N-(2-methacryloyloxyethyl)-9-methylanthracene carbamate was replaced with N-anthracene methacrylamide. The copolymer obtained was found to have about 70 mol % of allyl methacrylate units based on the $^1$H-NMR spectrum. The polymer had a weight average molecular weight (Mw) of 35,000 and number average molecular weight (Mn) of 19,455 as measured on a gel-permeation chromatography using polystyrene standard.

The polymer was dissolved in propylene glycol monomethyl ether acetate (PGMEA) (3 wt % solids) and applied as a bottom anti-reflective coating material and evaluated as described in the Application Example 1. The profiles showed no standing waves due to reflection and scattering of light and the bottom anti-reflective coating material had a n and k values of 1.54 and 0.42 respectively at 248 nm and etch rate of 141 nm/min. Additionally, no intermixing between resist and the bottom anti-reflective coating was observed.

EXAMPLE 8

Terpolymerization of N-(2-methacryloyloxyethyl)-9-methylanthracene carbamate, methyl methacrylate, and divinylbenzene and application as a bottom anti-reflective coating In a three neck flask fitted with condenser, nitrogen inlet and outlet, there was added 3.634 g (0.01 mol) of N-(2-methacryloyloxyethyl)-9-methylanthracene carbamate, 4.00 g (0.04 mol) of methyl methacrylate, 0.65 g (0.005 mol) of divinylbenzene (55% m and p isomer), 0.33 g of α,α'-azobis (isobutyronitrile) and 80 g of tetrahydrofuran and the contents were purged with dry nitrogen. The reaction mixture was heated to 70° C. and stirred at that temperature for 5 hours under flowing nitrogen. After the completion of the reaction, it was cooled to room temperature and the polymer formed was reprecipitated into isopropanol. The white powder was dried under vacuum (1 Torr) at room temperature to yield 4.14 g (50%) of polymer. The terpolymer was found to have about 7 mol % of vinylbenzene units based on the $^1$H-NMR spectrum. The polymer had a weight average molecular weight (Mw) of 15,322 and number average molecular weight (Mn) of 9,822 as measured on a gel-permeation chromatography using polystyrene standard.

The polymer was dissolved in propylene glycol monomethyl ether acetate (PGMEA) (3 wt % solids) and applied as a bottom anti-reflective coating material and evaluated as described in the Application Example 1. The profiles showed no standing waves due to reflection and scattering of light and the bottom anti-reflective coating material had n and k values of 1.57 and 0.39 respectively and etch rate of 128 nm/min. Additionally, no intermixing between resist and the bottom anti-reflective coating was observed.

EXAMPLE 9

Terpolymerization of N-(1-anthracene)-N'-(2-methacryloyloxyethyl)urea, methyl methacrylate, and divinylbenzene and application as a bottom anti-reflective coating Terpolymerization was carried out similar to Example 8 except that N-(2-methacryloyloxyethyl)-9-methylanthracene carbamate was replaced with N-(1-anthracene)-N'-(2-methacryloyloxyethyl)urea. The terpolymer was found to have about 9 mol % of vinylbenzene units based on the $^1$H-NMR spectrum. The polymer obtained had a weight average molecular weight (Mw) of 16,450 and number average molecular weight (Mn) of 8,000 as measured on a gel-permeation chromatography using polystyrene standard.

The polymer was dissolved in propylene glycol monomethyl ether acetate (PGMEA) (3 wt % solids) and applied as a bottom anti-reflective coating material and evaluated as described in the Application Example 1. The profiles showed no standing waves due to reflection and scattering of light and the bottom anti-reflective coating material had n and k values of 1.67 and 0.40 respectively and etch rate of 132 nm/min. Additionally, no intermixing between resist and the bottom anti-reflective coating was observed.

EXAMPLE 10

Terpolymerization of 9-anthracenemethyl methacrylate, methyl methacrylate, and divinylbenzene and application as a bottom anti-reflective coating Terpolymerization was carried out similar to Example 8 except that N-(2-methacryloyloxyethyl)-9-methylanthracene carbamate was replaced with 9-anthracenemethyl methacrylate. The terpolymer obtained was found to have about 10 mol % of vinylbenzene units based on the $^1$H-NMR spectrum. The polymer had a weight average molecular weight (Mw) of 19,450 and number average molecular weight (Mn) of 8,600 as measured on a gel-permeation chromatography using polystyrene standard.

The polymer was dissolved in propylene glycol monomethyl ether acetate (PGMEA) (3 wt % solids) and applied as a bottom anti-reflective coating material and evaluated as described in the Application Example 1. The profiles showed no standing waves due to reflection and scattering of light and the bottom anti-reflective coating material had n and k values of 1.57 and 0.39 respectively and etch rate of 130 nm/min. Additionally, no intermixing between resist and the bottom anti-reflective coating was observed.

As described in Examples 1 to 10, when a copolymer has an recurring unit having an epoxy group or double bond, no intermixing between resist and anti-reflective coating occurs due to curing of the anti-reflective coating by cross-linking after baking. Due to the curing of the anti-reflective coating, no footing and no leaving of exposed resist film upon development also occur. Further the anti-reflective coating showed the same good step coverage and storage stability as commercially available ones or more than that.

EXAMPLE 11

Copolymerization of N-(2-methacryloyloxyethyl)-9-methylanthracene carbamate and methyl methacrylate and use of the copolymer in a bottom anti-reflective coating formulation In a three neck flask fitted with condenser, nitrogen inlet and outlet, there was added 3.634 g (0.01 mol) of N-(2-methacryloyloxyethyl)-9-methylanthracene carbamate, 4.00 g (0.04 mol) of methyl methacrylate, 0.23 g of α,α'-azobis(isobutyronitrile) and 60 g of tetrahydrofuran and the contents were purged with dry nitrogen. The reaction mixture was heated to 70° C. and stirred at that temperature for 5 hours under flowing nitrogen. After the completion of the reaction, it was cooled to room temperature and the polymer formed was reprecipitated into n-hexane. The white powder was dried under vacuum (1 Torr) at room temperature to yield 4 g (86%) of polymer. The copolymer was found to have about 75 mol % of methyl methacrylate units based on the $^1$H-NMR spectrum. The polymer had a weight average molecular weight (Mw) of 33,700 and number average molecular weight (Mn) of 12,900 as measured on a gel-permeation chromatography using polystyrene standard.

The polymer was dissolved in propylene glycol monomethyl ether acetate (PGMEA) (3 wt % solids) and applied as a bottom anti-reflective coating material and evaluated as described in the Application Example 1. Intermixing of resist and the bottom anti-reflective coating material was observed. In the next step, 0.9 g of the copolymer, 0.18 g of nikalac (trade name of hexamethylmelamine supplied by Sanwa chemical company) cross-linking agent and 0.018 g of thermal acid-generator, PI-105 (N-methanesulfonyloxy isophthalamide, supplied by Midori Kagaku company) were dissolved in 30 ml of PGMEA and the solution was applied as a bottom anti-reflective coating as described in the Application Example 1. The profiles showed no standing waves due to reflection and scattering of light and the bottom anti-reflective coating had n and k values of 1.58 and 0.40 respectively at 248 nm and etch rate of 138 nm/min. By the addition of the cross-linking agent and the thermal acid-generator, no intermixing between resist and the bottom anti-reflective coating comes to take place.

EXAMPLE 12

Copolymerization of N-(1-anthracene)-N'-(2-methacryloyloxyethyl)urea and methyl methacrylate and use of the copolymer in a bottom anti-reflective coating formulation The copolymer and the bottom anti-reflective coating formulation using the copolymer were prepared similar to Example 11 except that N-(2-methacryloyloxyethyl)-9-methylanthracene carbamate was replaced with N-(1-anthracene)-N'-(2-methacryloyloxyethyl)urea. The polymer had a weight average molecular weight (Mw) of 23,700 and number average molecular weight (Mn) of 9,000 as measured on a gel-permeation chromatography using polystyrene standard.

The polymer was dissolved in propylene glycol monomethyl ether acetate (PGMEA) (3 wt % solids) and applied as a bottom anti-reflective coating material and evaluated as described in the Application Example 1. Intermixing between resist and the bottom anti-reflective coating material was observed. In the next step, 0.9 g of the copolymer, 0.18 g of nikalac (trade name of hexamethylmelamine supplied by Sanwa chemical company) cross-linking agent and 0.018 g of thermal acid-generator, PI-105 (N-methanesulfonyloxy isophthalamide, supplied by Midori Kagaku company) were dissolved in 30 ml of PGMEA and the solution was applied as bottom anti-reflective coating and evaluated as described in the Application Example 1. The profiles showed no standing waves due to reflection and scattering of light and the bottom anti-reflective coating material had n and k values of 1.59 and 0.42 respectively at 248 nm and etch rate of 136 nm/min. By the addition of the cross-linking agent and the thermal acid-generator, no intermixing between resist and the bottom anti-reflective coating comes to take place.

EXAMPLE 13

Copolymerization of N-(2-methacryloyloxyethyl)-9-methylanthracene carbamate and 2-(methacyloyloxy)ethyl acetoacetate and use of the copolymer in a bottom anti-reflective coating formulation In a three neck flask fitted with condenser, nitrogen inlet and outlet, there was added 3.634 g (0.01 mol) of N-(2-methacryloyloxyethyl)-9-methylanthracene carbamate, 2.142 g (0.01 mol) of 2-(methacyloyloxy)ethyl acetoacetate, 0.23 g of α,α'-azobis(isobutyronitrile) and 60 g of tetrahydrofuran and the contents were purged with dry nitrogen. The reaction mixture was heated to 70° C. and stirred at that temperature for 5 hours under flowing nitrogen. After the completion of the reaction, it was cooled to room temperature and the polymer formed was reprecipitated into isopropanol. The white powder was dried under vacuum (1 Torr) at room temperature to yield 5 g (87%) of polymer. The copolymer was found to have about 45 mol % of 2-(methacyloyloxy)ethyl acetoacetate units based on the $^1$H-NMR spectrum. The polymer had a weight average molecular weight (Mw) of 23,700 and number average molecular weight (Mn) of 12,900 as measured on a gel-permeation chromatography using polystyrene standard.

0.9 g of the copolymer, 0.18 g of nikalac (trade name of hexamethylmelamine supplied by Sanwa chemical company) cross-linking agent and 0.018 g of thermal acid-generator, PI-105 (N-methanesulfonyloxy isophthalamide, supplied by Midori Kagaku company) were dissolved in 30 ml of PGMEA and the solution was applied as a bottom anti-reflective coating material and evaluated as described in the Application Example 1. The profiles showed no standing waves due to reflection and scattering of light and the bottom anti-reflective coating material had n and k values of 1.54 and 0.35 respectively at 248 nm and etch rate of 143 nm/min. By the addition of the cross-linking agent and the thermal acid-generator, no intermixing between resist and the bottom anti-reflective coating comes to take place.

Additionally, the anti-reflective coatings in Examples 11 to 13 showed the same good step coverage as commercially available ones or more than that.

Advantages of the Invention

As has been described in detail, the polymers of the present invention show good light absorbing property for exposing lights of 100 to 450 nm in wavelength, and the composition for the anti-reflective coating or the light absorbing coating containing the polymer has such a high effect of preventing reflection of irradiation light from the substrate that it does not cause the problem of standing waves or reflective notching. The copolymers cause cross-linking or curing of the coating upon baking owing to the cross-linking group thereof, thus diffusion of photo-generated acid into the anti-reflective coating or the like and intermixing between the resist and the anti-reflective coating or the like being prevented. In addition, footing or remaining of the coating upon development do not take place, and excellent storage stability and is step coverage are attained. Therefore, a resist pattern with high resolution and high accuracy can easily be formed, which greatly contributes to the production of IC with high integration.

INDUSTRIAL APPLICABILITY

As has been described hereinbefore, in manufacturing integrated circuits with high integration, the composition for the anti-reflective coating or the light absorbing coating in accordance with the present invention is useful as a composition for forming an anti-reflective coating or a light absorbing coating in forming a resist pattern. Further, the polymers in accordance with the present invention are used as components of these compositions for the anti-reflective coating or the light absorbing coating and can impart to the resulting anti-reflective coating or light absorbing property good anti-reflective property or light absorbing property and cross-linking property of the coating.

What is claimed is:

1. A composition for an anti-reflective coating or a light absorbing coating containing a polymer represented by general formula I:

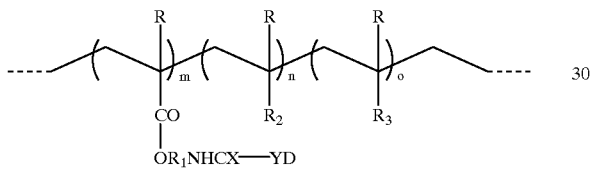

wherein

R represents a hydrogen atom or an alkyl group; $R_1$ represents an alkylene group, a substituted alkylene group, a cycloalkylene group, a substituted cycloalkylene group, a phenylene group or a substituted phenylene group; $R_2$ represents an optionally substituted, vinyl group-containing phenyl group, —$OR_4$ or —$COOR_4$, in which $R_4$ represents an alkyl group having a double bond or epoxy group; $R_3$ represents a halogen atom, a cyano group, an acetate group, —COOH, —$CONH_2$, a substituted or non-substituted phenyl group, —$COOR_5$ or —$OR_5$, in which $R_5$ represents a substituted or non-substituted straight-chained, cyclic or branched alkyl group, or an alkyl or aryl group containing an ester or carbonyl group; X is either O or S; Y is either O or $NR_6$ group in which $R_6$ is a hydrogen atom or a substituted or non-substituted phenyl or cyclic, straight-chained or branched alkyl group; D is an organic chromophore which absorbs the exposed wavelength (100–450 nm) and represents a substituted or non-substituted, anthracene, anthraquinone, acridine, azobenzene, fluorene, fluorenone, carbazole, N-alkylcarbazole, dibenzofuran, phenanthrene, or pyrene, bound directly or through an alkylene group; and m and n are any numbers greater than 0 and o is any number including zero.

2. The composition of claim 1, wherein R in the general formula I is a hydrogen atom or a methyl group; $R_1$ is an ethylene group; X is O; Y is either O or NH group; $R_2$ is —COO $R_4$ in which $R_4$ represents an alkyl group having a double bond or epoxy group; and m, n and o are any numbers greater than 0.

3. The composition of claim 2, wherein $R_3$ is —$COOR_5$ in which $R_5$ is a methyl group, an acetoacetoxyethyl group, an ethyl group, a cyclohexyl group or a hydroxyethyl group.

4. The composition of claim 1, wherein the subsbituents of the organic chromophore D comprise at least one group selected from alkyl, aryl, halogen atom, alkoxy, nitro, aldehyde, cyano, amide, dialkylamino, sulfonamide, imide, carboxylic acid, carboxylic acid ester, sulfonic acid, sulfonic acid ester, alkylamino and arylamino.

5. A composition for an anti-reflective coating or a light absorbing coating containing a polymer represented by general formula II:

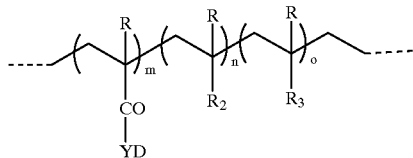

wherein

R represents a hydrogen atom or an alkyl group; $R_2$ represents an optionally substituted, vinyl group-containing phenyl group, —$OR_4$ or —$COOR_4$, in which $R_4$ represents an alkyl group which has a double bond or epoxy group; $R_3$ represents a halogen atom, a cyano group, an acetate group, —COOH, —$CONH_2$, a substituted or non-substituted phenyl group, —$COOR_5$ or —$OR_5$, in which $R_5$ represents a substituted or non-substituted straight-chained, cyclic or branched alkyl group, or an alkyl or aryl group containing an ester or carbonyl group; Y is either O or $NR_6$ group, in which $R_6$ represents a hydrogen atom or a substituted or non-substituted phenyl or cyclic, straight-chained or branched alkyl group; D is an organic chromophore which absorbs the exposed wavelength (100–450 nm) and represents a substituted or non-substituted benzene ring, condensed ring or heterocyclic ring bound directly or through an alkylene group, wherein said substituted or non-substituted benzene ring, condensed ring or heterocyclic ring is a member selected from the group consisting of non-substituted phenyl, substituted benzyl, non-substituted benzyl, substituted naphthalene, non-substituted naphthalene, substituted anthracene, non-substituted anthracene, substituted anthraquinone, non-substituted anthraquinone, substituted acridine, non-substituted acridine, substituted fluorene, non-substituted fluorene, substituted fluorenone, nonsubstituted fluorenone, substituted carbazole, non-substituted carbazole, substituted N-alkylcarbazole, non-substituted N-alkylcarbazole, substituted dibenzofuran, non-substituted dibenzofuran, substituted phenanthrene, non-substituted phenanthrene, substituted pyrene, and non-substituted pyrene; and m and n are any numbers greater than 0 and o is any number including zero.

6. The composition of claim 5, wherein the substituents of the organic chromophore D comprise at least one group selected form alkyl, aryl, halogen atom, alkoxy, nitro, aldehyde, cyano, amide, dialkylamino, sulfonamide, imide, carboxylic acid, carboxylic acid ester, sulfonic acid, sulfonic acid ester, alkylamino and arylamino.

7. A composition for an anti-reflective coating or a light absorbing coating containing a polymer represented by general formula I:

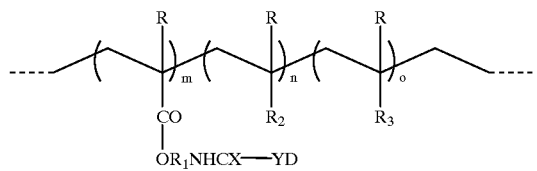

wherein
R in the general formula I represents a hydrogen atom or a methyl group; $R_1$ is an ethylene group; X is O; Y is either O or NH group; $R_2$ is an optionally substituted, vinyl group-containing phenyl group; $R_3$ is a halogen atom, a cyano group, an acetate group, —COOH, —$CONH_2$, a substituted or non-substituted phenyl group, or —$COOR_5$ or —$OR_5$, in which $R_5$ represents or non-substituted straight-chained, cyclic or branched alkyl group, or an alkyl or aryl group containing an ester or carbonyl group; D is an organic chromophore which absorbs the exposed wavelength (100–450 nm) and represents a substituted or non-substituted, benzene ring, condensed ring or heterocyclic ring bound directly or through an alkylene group; and m and n are any numbers greater than 0 and o is any number including zero.

8. A composition for an anti-reflective coating or a light absorbing coating containing a polymer represented by general formula II

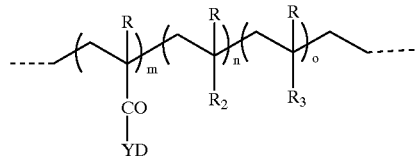

wherein
R in the general formula II represents a hydrogen atom or a methyl group; $R_2$ represents an optionally substituted, vinyl group-containing phenyl group; $R_3$ represents a halogen atom, a cyano group, an acetate group, —$CONH_2$, a substituted or non-substituted phenyl group, or —$COOR_5$ or —$OR_5$, in which $R_5$ represents a substituted or non-substituted straight-chained, cyclic or branched alkyl group, or an alkyl or aryl group containing an ester or cabonyl group; Y is either O or NH group; D is an organic chromophore which absorbs the exposed wavelength (100–450 nm) and represents a substituted or non-substituted, benzene ring, condensed ring or heterocyclic ring bound directly or through an alkylene group; and m, n and o are any numbers greater than 0.

9. A composition for an anti-reflective coating or a light absorbing coating containing a polymer represented by general formula II:

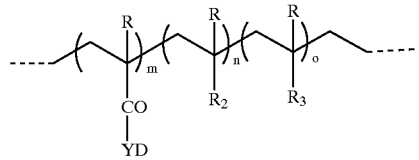

wherein
R in the general formula II represents a hydrogen atom or a methyl group; $R_2$ is —$COOR_4$, in which $R_4$ represents an alkyl group having a double bond; $R_3$ represents a a halogen atom, a cyano group, an acetate group, —$CONH_2$, a substituted or non-substituted phenyl group, or —$COOR_5$ or —$OR_5$, in which $R_5$ represents a substituted or non-substituted straight-chained, cyclic or branched alkyl group, or an alkyl or aryl group containing an ester or carbonyl group; Y is O; D is an organic chromophore which absorbs the exposed wavelength (100–450 nm) and represents a substituted or benzene ring, condensed ring or heterocyclic ring bound directly or through an alkylene group; and m, n and o are any numbers greater than 0.

10. A composition for an anti-reflective coating or a light absorbing coating comprising a polymer having at least one recurring unit represented by following general III:
General formula III

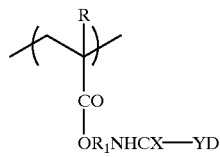

wherein
R represents a hydrogen atom or an alkyl group; $R_1$ represents an alkylene group, a substituted alkylene group, a cycloalkylene group, a substituted cycloalkylene group, a phenylene group or a substituted phenylene group; X is either O or S; Y is either O or $NR_6$ group, in which $R_6$ is a hydrogen atom or a substituted or non-substituted phenyl or cyclic, straight-chained or branched alkyl group; D is an organic chromophore which absorbs the exposed wavelength (100–450 nm) and represents a substituted or non-substituted anthraquinone, acridine, azobenzene, fluorene, fluorenone, carbazole, N-alkylcarbazole, dibenzofuran, phenantherene, or pyrene bound directly or through an alkylene group; or General formula IV
General formula IV

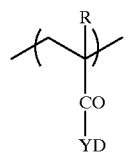

wherein
R represents a hydrogen atom or an alkyl group; Y is either O or $NR_6$ group, in which $R_6$ is a hydrogen atom or a substituted or non-substituted phenyl or cyclic, straight-chained or branched alkyl group; D is an organic chromophore which absorbs the exposed wavelength (100–450 nm) an represents a substituted or non-substituted benzene ring, condensed ring or heterocyclic ring bound directly or through an alkylene group, wherein said substituted or non-substituted benzene ring, condensed ring or heterocyclic ring is a member selected from the group consisting of non-substituted phenyl, substituted benzyl, non-substituted benzyl, substituted naphathalene, non-substituted naphathalene, substituted anthraquinone, nonsubstituted anthraquinone, substitute acridine, non-substituted acridine, substituted fluorene, non-substituted fluorene, substituted fluorenone, nonsubstituted fluorenone, substituted carbazale non-substituted carbazole, substituted N-alkylcarbazole, non-substituted N-alkylcarbazole, substituted dibenzofuran, non-substituted dibenzofuran, substituted phenantherene, non-substituted phenanthrene, substituted pyrene, and non-substituted pyrene; a cross-linking agent and a thermal acid-generator.

11. A polymer represented by general formula I:

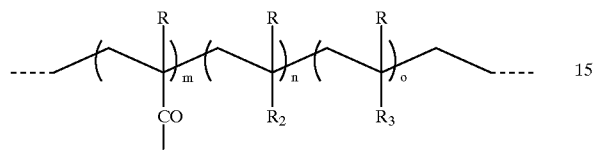

wherein

R represents a hydrogen atom or an alkyl group; $R_1$ represents an alkylene group, a substituted alkylene group, a cycloalkylene group, a substituted cycloalkylene group, a phenylene group or a substituted phenylene group; $R_2$ represents an optionally substituted, vinyl group-containing phenyl group, —$OR_4$ or —$COOR_4$, in which $R_4$ represents an alkyl group having a double bond or epoxy group; $R_3$ represents a halogen atom, a cyano group, an acetate group, —COOH, —$CONH_2$, a substituted or non-substituted phenyl group, —$COOR_5$ or —$OR_5$, in which $R_5$ represents a substituted or non-substituted straight-chained, cyclic or branched alkyl group, or an alkyl or aryl group containing an ester or carbonyl group; X is either O or S; Y is either O or $NR_6$ group in which $R_6$ is a hydrogen atom or a substituted or non-substituted phenyl or cyclic, straight-chained or branched alkyl group; D is an organic chromophore which absorbs the exposed wavelength (100–450 nm) and represents a substituted or non-substituted, anthracene, anthraquinone, acridine, azobenzene, fluorene, fluorenone, carbazole, N-alkylcarbazole, dibenzofuran, phenanthrene, or pyrene, bound directly or through an alkylene group; and m and n are any numbers greater than 0 and o is any number including zero.

12. A polymer represented general formula II:

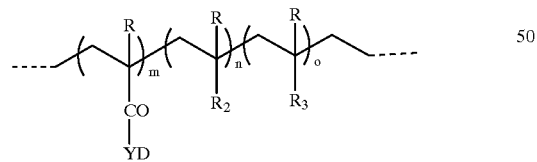

wherein

R represents a hydrogen atom or an alkyl group; $R_2$ represents an optionally substituted, vinyl group-containing phenyl group, —$OR_4$ or —$COOR_4$, in which $R_4$ represents an alkyl group which has a double bond or epoxy group; $R_3$ represents a halogen atom, a cyano group, an acetate group, —COOH, —$CONH_2$, a substituted or non-substituted phenyl group, —$COOR_5$ or —$OR_5$, in which $R_5$ represents a substituted or non-substituted straight-chained, cyclic or branched alkyl group, or an alkyl or aryl group containing an ester or carbonyl group; Y is either O or $NR_6$ group, in which $R_6$ represents a hydrogen atom or a substituted or non-substituted phenyl or cyclic, straight-chained or branched alkyl group; D is an organic chromophore which absorbs the exposed wavelength (100–450 nm) and represents a substituted or non-substituted benzene ring, condensed ring or heterocyclic ring bound directly or through an alkylene group, wherein said substituted or non-substituted benzene ring, condensed ring or heterocyclic ring is a member selected from the group consisting of non-substituted phenyl, substituted benzyl, non-substituted benzyl, substituted naphthalene, non-substituted naphthalene, substituted anthracene, non-substituted anthracene, substituted anthraquinone, non-substituted anthraquinone, substituted acridine, non-substituted acridine, substituted fluorene, non-substituted fluorene, substituted fluorenone, nonsubstituted fluorenone, substituted carbazole, non-substituted carbazole, substituted N-alkylcarbazole, non-substituted N-alkylcarbazole, substituted dibenzofuran, non-substituted dibenzofuran, substituted phenanthrene, non-substituted phenanthrene, substituted pyrene, and non-substituted pyrene; and m and n are any numbers greater than 0 and o is any number including zero.

13. A method for preparing a composition for an anti-reflective coating or a light absorbing coating comprising dissolving a polymer represented by the general formula I

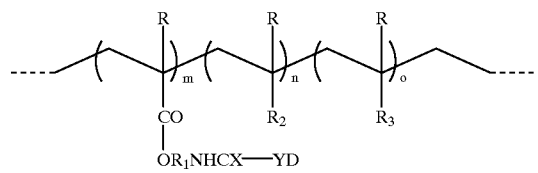

wherein

R represents a hydrogen atom or an alkyl group; $R_1$ represents an alkylene group, a substituted alkylene group, a cycloalkylene group, a substituted cycloalkylene group, a phenylene group or a substituted phenylene group; $R_2$ represents an optionally substituted, vinyl group-containing phenyl group, —$OR_4$ or —$COOR_4$, in which $R_4$ represents an alkyl group having a double bond or epoxy group; $R_3$ represents a halogen atom, a cyano group, an acetate group, —COOH, —$CONH_2$, a substituted or non-substituted phenyl group, —$COOR_5$ or —$OR_5$, in which $R_5$ represents a substituted or non-substituted straight-chained, cyclic or branched alkyl group, or an alkyl or aryl group containing an ester or carbonyl group; X is either O or S; Y is either O or $NR_6$ group in which $R_6$ is a hydrogen atom or a substituted or non-substituted phenyl or cyclic, straight-chained or branched alkyl group; D is an organic chromophore which absorbs the exposed wavelength (100–450 nm) and represents a substituted or non-substituted, anthracene, anthraquinone, acridine, azobenzene, fluorene, fluorenone, carbazole, N-alkylcarbazole, dibenzofuran, phenanthrene, or pyrene, bound directly or through an alkylene group; and m and n are any numbers greater than 0 and o is any number including zero; or general formula II,

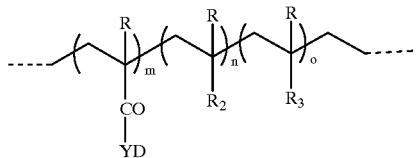

wherein

R represents a hydrogen atom or an alkyl group; $R_2$ represents an optionally substituted, vinyl group containing phenyl group, $-OR_4$ or $-COOR_4$, in which $R_4$ represents an alkyl group which has a double bond or epoxy group; $R_3$ represents a halogen atom, a cyano group, an acetate group, $-COOH$, $-CONH_2$, a substituted or non-substituted phenyl group, $-COOR_5$ or $-OR_5$, in which $R_5$ represents a substituted or non-substituted straight-chained, cyclic or branched alkyl group, or an alkyl or aryl group containing an ester or carbonyl group; Y is either O or $NR_6$ group, in which $R_6$ represents a hydrogen atom or a substituted or non-substituted phenyl or cyclic, straight-chained or branched alkyl group; D is an organic chromophore which absorbs the exposed wavelength (100–450 nm) and represents a substituted or non-substituted benzene ring, condensed ring or heterocyclic ring bound directly or through an alkylene group, wherein said substituted or non-substituted benzene ring, condensed ring or heterocyclic ring is a member selected from the group consisting of non-substituted phenyl, substituted benzyl, non-substituted benzyl, substituted naphthalene, non-substituted naphthalene, substituted anthracene, non-substituted anthracene, substituted anthraquinone, non-substituted anthraquinone, substituted acridine, non-substituted acridine, substituted fluorene, non-substituted fluorene, substituted fluorenone, nonsubstituted fluorenone, substituted carbazole, non-substituted carbazole, substituted N-alkylcarbazole, non-substituted N-alkylcarbazole, substituted dibenzofuran, non-substituted dibenzofuran, substituted phenanthrene, non-substituted phenanthrene, substituted pyrene, and non-substituted pyrene; and m and n are any numbers greater than 0 and o is any number including zero; in at least one solvent.

14. A method for forming an anti-reflective coating or a light absorbing coating comprising the steps of:
  (I) optionally filtering the composition for an anti-reflective coating or a light absorbing coating produced by the method of claim 12;
  (II) coating the composition onto a substrate; and
  (III) baking the coated substrate at 50 to 250° C.

15. An anti-reflective coating or a light absorbing coating formed by the method of claim 13.

16. A method for manufacturing an integrated circuit comprising the steps of:
  (I) applying a positive- or negative-working photoresist which is sensitive to ultraviolet ray of at least one wavelength in the range of about 100 nm to 450 nm on the anti-reflective coating or the light absorbing coating of claim 14;
  (II) exposing the substrate coated with the anti-reflective coating or light absorbing coating and the photoresist; and
  (III) developing the exposed photoresist; and transferring the image onto the substrate by dry or wet etching to form an integrated circuit element.

17. A composition for an anti-reflective coating or a light absorbing coating containing a polymer represented by general formula II:

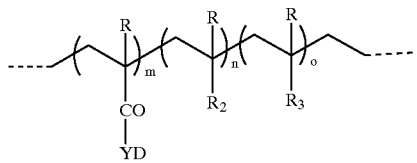

wherein

R represents a hydrogen atom or an alkyl group; $R_2$ represents an optionally substituted, vinyl group-containing phenyl group, $-OR_4$ or $-COOR_4$, in which $R_4$ represents an alkyl group which has a double bond or epoxy group; $R_3$ represents a halogen atom, a cyano group, an acetate group, $-COOH$, $-CONH_2$, a substituted or non-substituted phenyl group, $-COOR_5$ or $-OR_5$, in which $R_5$ represents a substituted or non-substituted straight-chained, cyclic or branched alkyl group, or an alkyl or aryl group containing an ester or carbonyl group; Y is either O or $NR_6$ group, in which $R_6$ represents a hydrogen atom or a substituted or non-substituted phenyl or cyclic, straight-chained or branched alkyl group; D is an organic chromophore which absorbs the exposed wavelength (100–450 nm) and represents a substituted or non-substituted benzene ring, condensed ring or heterocyclic ring bound directly or through an alkylene group, wherein said substituted or non-substituted benzene ring, condensed ring or heterocyclic ring is a member selected from the group consisting of non-substituted phenyl, substituted benzyl, non-substituted benzyl, substituted naphthalene, non-substituted naphthalene, substituted anthraquinone, non-substituted anthraquinone, substituted acridine, non-substituted acridine, substituted fluorene, non-substituted fluorene, substituted fluorenone, nonsubstituted fluorenone, substituted carbazole, non-substituted carbazole, substituted N-alkylcarbazole, non-substituted N-alkylcarbazole, substituted dibenzofuran, non-substituted dibenzofuran, substituted phenanthrene, non-substituted phenanthrene, substituted pyrene, and non-substituted pyrene; and m and n are any numbers greater than 0 and o is any number including zero.

18. A polymer represented by general formula II:

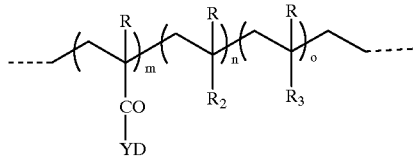

wherein

R represents a hydrogen atom or an alkyl group; $R_2$ represents an optionally substituted, vinyl group-containing phenyl group, $-OR_4$ or $-COOR_4$, in which $R_4$ represents an alkyl group which has a double bond or epoxy group; $R_3$ represents a halogen atom, a cyano group, an acetate group, $-COOH$, $-CONH_2$, a substituted or non-substituted phenyl group, $-COOR_5$ or $-OR_5$, in which $R_5$ represents a substituted or non-substituted straight-chained, cyclic or branched alkyl group, or an alkyl or aryl group containing an ester or carbonyl group; Y is either O or NR₆ group, in which R₆ represents a hydrogen atom or a substituted or non-substituted phenyl or cyclic, straight-chained or branched alkyl group; D is an organic chromophore which absorbs the exposed wavelength (100–450 nm) and represents a substituted or non-substituted benzene ring, condensed ring or heterocyclic ring bound directly or through an alkylene group, wherein said substituted or non-substituted benzene ring, condensed ring or heterocyclic ring is a member selected from the group consisting of non-substituted phenyl, substituted benzyl, non-substituted benzyl, substituted naphthalene, non-substituted naphthalene, substituted anthraquinone, non-substituted anthraquinone, substituted acridine, non-substituted acridine, substituted fluorene, non-substituted fluorene, substituted fluorenone, nonsubstituted fluorenone, substituted carbazole, non-substituted carbazole, substituted N-alkylcarbazole, non-substituted N-alkylcarbazole, substituted dibenzofuran, non-substituted dibenzofuran, substituted phenanthrene, non-substituted phenanthrene, substituted pyrene, and non-substituted pyrene; and m and n are any numbers greater than 0 and o is any number including zero.

19. A composition for an anti-reflective coating or a light absorbing coating comprising a polymer having at least one recurring unit represented by the following general formula III, a cross-linking agent and a thermal acid-generator:

General formula III

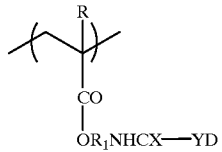

wherein

R represents a hydrogen atom or an alkyl group; R₁ represents an alkylene group, a substituted alkylene group, a cycloalkylene group, a substituted cycloalkylene group, a phenylene group or a substituted phenylene group; X is either O or S; Y is either O or NR₆ group, in which R₆ is a hydrogen atom or a substituted or non-substituted phenyl or cyclic, straight-chained or branched alkyl group; D is an organic chromophore which absorbs the exposed wavelength (100–450 nm) and represents a substituted or non-substituted anthracene, anthraquinone, acridine, fluorene, fluorenone, carbazole, N-alkylcarbazole, dibenzofuran, phenanthrene, or pyrene bound directly or through an alkylene group.

20. A method for preparing a composition for an anti-reflective coating or a light absorbing coating comprising dissolving in at least one solvent a polymer represented by the general formula I

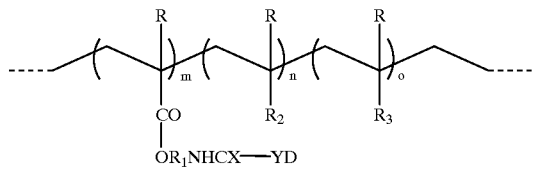

wherein

R represents a hydrogen atom or an alkyl group; R₁ represents an alkylene group, a substituted alkylene group, a cycloalkylene group, a substituted cycloalkylene group, a phenylene group or a substituted phenylene group; R₂ represents an optionally substituted, vinyl group-containing phenyl group, —OR₄ or —COOR₄, in which R₄ represents an alkyl group having a double bond or epoxy group; R₃ represents a halogen atom, a cyano group, an acetate group, —COOH, —CONH₂, a substituted or non-substituted phenyl group, —COOR₅ or —OR₅, in which R₅ represents a substituted or non-substituted straight-chained, cyclic or branched alkyl group, or an alkyl or aryl group containing an ester or carbonyl group; X is either O or S; Y is either O or NR₆ group in which R₆ is a hydrogen atom or a substituted or non-substituted phenyl or cyclic, straight-chained or branched alkyl group; D is an organic chromophore which absorbs the exposed wavelength (100–450 nm) and represents a substituted or non-substituted, anthracene, anthraquinone, acridine, azobenzene, fluorene, fluorenone, carbazole, N-alkylcarbazole, dibenzofuran, phenanthrene, or pyrene, bound directly or through an alkylene group; and m and n are any numbers greater than 0 and o is any number including zero.

21. A composition for an anti-reflective coating or a light absorbing coating containing a polymer represented by general formula I:

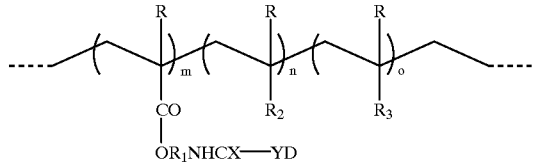

wherein

R represents a hydrogen atom or a methyl group; R₁ represents an ethylene group, a phenylene group or a substituted phenylene group; R₂ represents an optionally substituted, vinyl group-containing phenyl group, or —COOR₄, in which R₄ represents an allyl group or a glycidyl group; R₃ represents a halogen atom, a cyano group, an acetate group, —COOH, —CONH₂, a substituted or non-substituted phenyl group, or —COOR₅, in which R₅ represents a methyl group, a 2-hydroxyethyl group, or a 2-(acetoacetoxy)ethyl group; X is either O or S; Y is either O or NR₆ group in which R₆ is a hydrogen atom or a substituted or non-substituted phenyl group; D is an organic chromophore which absorbs the exposed wavelength (100–450 nm) and represents a substituted or non-substituted, anthracene, anthraquinone, acridine, azobenzene, fluorene, fluorenone, carbazole, N-alkylcarbazole, dibenzofuran, phenanthrene, or pyrene, bound directly or through a methylene group;

and m and n are any numbers greater than 0 and o is any number including zero.

22. A composition for an anti-reflective coating or a light absorbing coating containing a polymer represented by general formula II:

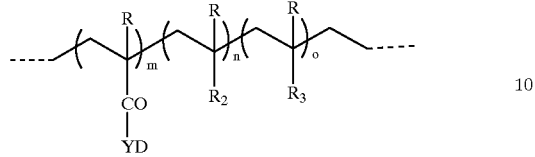

wherein
R represents a hydrogen atom or a methyl group; $R_2$ represents an optionally substituted, vinyl group-containing phenyl group, or —$COOR_4$, in which $R_4$ represents an allyl group or a glycidyl group; $R_3$ represents a halogen atom, a cyano group, an acetate group, —COOH, —$CONH_2$, a substituted or non-substituted phenyl group, or —$COOR_5$, in which $R_5$ represents a methyl group, a 2-hydroxyethyl group, or a 2-(acetoacetoxy)ethyl group; Y is either O or $NR_6$ group, in which $R_6$ represents a hydrogen atom or a substituted or non-substituted phenyl group; D is an organic chromophore which absorbs the exposed wavelength (100–450 nm) and represents a substituted or non-substituted benzene ring, condensed ring or heterocyclic ring bound directly or through a methylene group, wherein said substituted or non-substituted benzene ring, condensed ring or heterocyclic ring is a member selected from the group consisting of non-substituted phenyl, substituted benzyl, non-substituted benzyl, substituted naphthalene, non-substituted naphthalene, substituted anthracene, non-substituted anthracene, substituted anthraquinone, non-substituted anthraquinone, substituted acridine, non-substituted acridine, substituted fluorene, non-substituted fluorene, substituted fluorenone, nonsubstituted fluorenone, substituted carbazole, non-substituted carbazole, substituted N-alkylcarbazole, non-substituted N-alkylcarbazole, substituted dibenzofuran, non-substituted dibenzofuran, substituted phenanthrene, non-substituted phenanthrene, substituted pyrene, and non-substituted pyrene; and m and n are any numbers greater than 0 and o is any number including zero.

23. A composition for an anti-reflective coating or a light absorbing coating containing a polymer represented by general formula II:

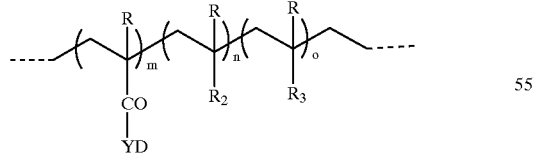

wherein
R represents a hydrogen atom or a methyl group; $R_2$ represents an optionally substituted, vinyl group-containing phenyl group, or —$COOR_4$, in which $R_4$ represents an allyl group; $R_3$ represents a halogen atom, a cyano group, an acetate group, —COOH, —$CONH_2$, a substituted or non-substituted phenyl group, or —$COOR_5$, in which $R_5$ represents a methyl group; Y is either O or $NR_6$ group, in which $R_6$ represents a hydrogen atom or a substituted or non-substituted phenyl group; D is an organic chromophore which absorbs the exposed wavelength (100–450 nm) and represents a substituted or non-substituted benzene ring, condensed ring or heterocyclic ring bound directly, wherein said substituted or non-substituted benzene ring, condensed ring or heterocyclic ring is a member selected from the group consisting of non-substituted phenyl, substituted benzyl, non-substituted benzyl, substituted naphthalene, non-substituted naphthalene, substituted anthracene, non-substituted anthracene, substituted anthraquinone, non-substituted anthraquinone, substituted acridine, non-substituted acridine, substituted fluorene, non-substituted fluorene, substituted fluorenone, nonsubstituted fluorenone, substituted carbazole, non-substituted carbazole, substituted N-alkylcarbazole, non-substituted N-alkylcarbazole, substituted dibenzofuran, non-substituted dibenzofuran, substituted phenanthrene, non-substituted phenanthrene, substituted pyrene, and non-substituted pyrene; and m and n are any numbers greater than 0 and o is any number including zero.

24. A composition for an anti-reflective coating or a light absorbing coating containing a polymer represented formula I:

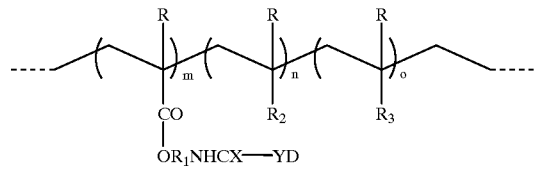

wherein
R in the general formula I represents a hydrogen atom or a methyl group; $R_1$ is an ethylene group; X is O; Y is either O or NH group; $R_2$ is an optionally substituted, vinyl group-containing phenyl group; $R_3$ is a halogen atom, a cyano group, an acetate group, —COOH, —$CONH_2$, a substituted or non-substituted phenyl group, or —$COOR_5$, in which $R_5$ represents methyl; D is an organic chromophore which absorbs the exposed wavelength (100–450 nm) and represents a substituted or non-substituted, benzene ring, condensed ring or heterocyclic ring bound directly or through a methylene group; and m and n are any numbers greater than 0 and o is any number including zero.

25. A composition for an anti-reflective coating or a light absorbing coating containing a polymer represented by general formula II:

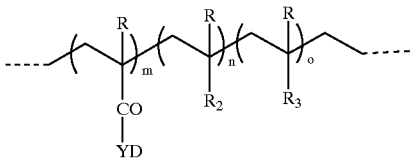

wherein
R in the general formula II represents a hydrogen atom or a methyl group; $R_2$ represents an optionally substituted, vinyl group-containing phenyl group; $R_3$ represents a halogen atom, a cyano group, an acetate group, —$CONH_2$, a substituted or non-substituted phenyl group, or —COOR$_5$, in which R$_5$ represents a methyl group, a 2-hydroxyethyl group, or a 2-(acetoacetoxy) ethyl group; Y is either O or NH group; D is an organic chromophore which absorbs the exposed wavelength (100–450 nm) and represents a substituted or non-substituted, benzene ring, condensed ring or heterocyclic ring bound directly or through a methylene group; and m, n and o are any numbers greater than 0.

26. A composition for an anti-reflective coating or light absorbing coating containing a polymer represented by general formula II:

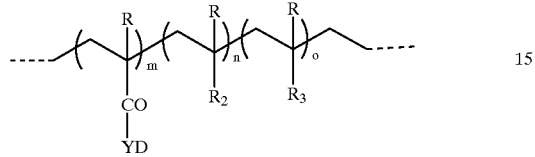

wherein

R in the general formula II represents a hydrogen atom or a methyl group; R$_2$ is —COOR$_4$, in which R$_4$ represents an allyl group; R$_3$ represents a halogen atom, a cyano group, an acetate group, —COOH, —CONH$_2$, a substituted or non-substituted phenyl group, or —COOR$_5$, in which R$_5$ represents a methyl group, a 2-hydroxyethyl group, or a 2-(acetoacetoxy)ethyl group; Y is either O or NH group; D is an organic chromophore which absorbs the exposed wavelength (100–450 nm) and represents a substituted or non-substituted, benzene ring, condensed ring or heterocyclic ring bound directly or through an alkylene group; and m and n are any numbers greater than 0 and o is any number including 0.

* * * * *